(12) United States Patent
Tamura

(10) Patent No.: US 9,030,083 B2
(45) Date of Patent: May 12, 2015

(54) PIEZOELECTRIC VIBRATING PIECE, PIEZOELECTRIC VIBRATOR, OSCILLATOR, ELECTRONIC APPARATUS AND RADIO CONTROLLED TIMEPIECE

(71) Applicant: SII Crystal Technology Inc., Chiba-shi, Chiba (JP)

(72) Inventor: Masanori Tamura, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 0 days.

(21) Appl. No.: 14/201,317

(22) Filed: Mar. 7, 2014

(65) Prior Publication Data

US 2014/0254328 A1    Sep. 11, 2014

(30) Foreign Application Priority Data

Mar. 11, 2013   (JP) .................. 2013-048457

(51) Int. Cl.
| | | |
|---|---|---|
| *H03H 9/21* | (2006.01) | |
| *H03H 9/02* | (2006.01) | |
| *H03H 9/10* | (2006.01) | |
| H03B 5/32 | (2006.01) | |
| G04R 20/10 | (2013.01) | |
| H03H 9/05 | (2006.01) | |

(52) U.S. Cl.
CPC .. *H03H 9/21* (2013.01); *H03B 5/32* (2013.01); *G04R 20/10* (2013.01); *H03H 9/02157* (2013.01); *H03H 9/0509* (2013.01); *H03H 9/0519* (2013.01); *H03H 9/1021* (2013.01)

(58) Field of Classification Search
CPC ........... H03H 9/19; H03H 9/21; H03H 9/215; H03H 2003/026; B06B 1/0659
USPC ............................ 310/370; 331/156; 333/200
See application file for complete search history.

(56) References Cited

U.S. PATENT DOCUMENTS

| | | | | |
|---|---|---|---|---|
| 3,462,939 | A * | 8/1969 | Kato et al. ................ | 368/157 |
| 4,410,827 | A * | 10/1983 | Kogure .................... | 310/370 |
| 7,193,354 | B2 * | 3/2007 | Kawashima ............. | 310/370 |
| 7,436,107 | B2 * | 10/2008 | Aizawa et al. ........... | 310/370 |
| 8,598,770 | B2 * | 12/2013 | Yamada et al. .......... | 310/370 |
| 8,665,032 | B2 * | 3/2014 | Tanaya et al. ............ | 331/156 |
| 8,724,431 | B2 * | 5/2014 | Hessler et al. ........... | 368/159 |
| 8,803,626 | B2 * | 8/2014 | Arimatsu ................. | 331/156 |

FOREIGN PATENT DOCUMENTS

| | | | |
|---|---|---|---|
| EP | 1732217 A1 * | 12/2006 | |
| JP | 2002141770 A * | 5/2002 | |
| JP | 2003-163568 A | 6/2003 | |
| JP | 2006-345517 A | 12/2006 | |
| JP | 2006-345519 A | 12/2006 | |

* cited by examiner

*Primary Examiner* — J. San Martin

(74) *Attorney, Agent, or Firm* — Brinks Gilson & Lione

(57) ABSTRACT

A piezoelectric vibrating piece includes: a pair of vibrating arm sections which are disposed at a distance away from each other in a width direction of a base section; the base section to which each base end of the pair of vibrating arm sections is connected; and a support arm section that is connected to the base section between the pair of vibrating arm sections and extends from the base section to the same side as the pair of vibrating arm sections, in which convex sections are formed continuous with side surfaces of roots of the vibrating arm sections and side surfaces of the base section.

7 Claims, 9 Drawing Sheets

PIEZOELECTRIC VIBRATING PIECE, PIEZOELECTRIC VIBRATOR, OSCILLATOR, ELECTRONIC APPARATUS AND RADIO CONTROLLED TIMEPIECE

RELATED APPLICATIONS

This application claims priority under 35 U.S.C. §119 to Japanese Patent Application No. 2013-048457 filed on Mar. 11, 2013, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic apparatus and a radio controlled timepiece.

2. Background Art

For example, in a cellular phone or a portable information terminal apparatus, a piezoelectric vibrator utilizing crystals or the like is often used as a device which is used in a time source, a timing source of a control signal or the like, and a reference signal source or the like. As a piezoelectric vibrator of this type, a piezoelectric vibrator is known in which a piezoelectric vibrating piece is hermetically sealed within a package in which a cavity is formed.

In the related art, the piezoelectric vibrating pieces having various shapes are known, and as one of them, a piezoelectric vibrating piece, which includes a pair of vibrating arm sections that are disposed by being spaced in a width direction, a base section that is connected to each of base ends of the pair of vibrating arm sections, and a support aim section that is connected to the base section between the pair of vibrating arm sections, is known (JP-A-2003-163568, JP-A-2006-345517 and JP-A-2006-345519). The piezoelectric vibrator is configured by bonding a mount section that is formed in the support arm section of the piezoelectric vibrating piece and an electrode pad on the side of the package with a conductive adhesive, a metal bump or the like.

Then, the piezoelectric vibrating piece is configured such that the pair of vibrating arm sections in which excitation electrodes are formed vibrate at a predetermined frequency to separate from or approach each other by applying a voltage from external electrodes formed outside the package to the piezoelectric vibrating piece.

However, when operating the piezoelectric vibrating piece, it is known that vibration leakage (leakage of vibration energy) occurs from the mount section of the base section to the side of the package. If the vibration leakage occurs, since a resonance frequency of the piezoelectric vibrating piece is no longer stable, it is necessary to suppress the vibration leakage as much as possible. Thus, a technique for reducing the vibration leakage is known by attenuating the vibration by separating a distance between the vibrating arm sections and the mount section.

SUMMARY OF THE INVENTION

However, a configuration capable of reducing the vibration leakage more effectively is required in addition to the configuration in which the distance between the vibrating arm sections and the mount section is separated.

Thus, an object of the invention is to provide a piezoelectric vibrating piece capable of suppressing the vibration leakage to the side of the package in the mount section of the piezoelectric vibrating piece as much as possible, a piezoelectric vibrator, an oscillator, an electronic apparatus and a radio controlled timepiece.

According to an aspect of the invention, there is provided a piezoelectric vibrating piece including: a pair of vibrating arm sections which are disposed at a distance away from each other in a width direction of a base section; the base section to which each base end of the pair of vibrating arm sections is connected; and a support arm section that is connected to the base section between the pair of vibrating arm sections and extends from the base section to the same side as the pair of vibrating arm sections, in which convex sections are formed continuous with side surfaces of roots of the vibrating arm sections and side surfaces of the base section.

In this case, since the convex sections are formed continuous with the side surfaces of the roots of the vibrating arm sections and the side surfaces of the base section so as to include a boundary between the vibrating arm sections and the base section, it is possible to attenuate the vibration transmitted from the vibrating arm sections to the base section in the convex sections. That is, it is possible to reduce the vibration leakage by consuming vibration energy of the vibration that occurs in the vibrating arm sections and propagates to the side of the base section in the convex sections.

In the piezoelectric vibrating piece, when the maximum length of the convex sections in the width direction is Wa, and a width of the vibrating arm sections is W, a relationship of $0.2 \times W \leq Wa \leq 1.4 \times W$ is preferably satisfied.

In this case, it is possible to reduce the vibration leakage more appropriately by making the maximum length Wa of the convex sections and the width of the vibrating arm sections the relationship of the above expression.

In the piezoelectric vibrating piece, widened sections are preferably formed in leading ends of the vibrating arm sections, and leading ends of the convex sections are preferably positioned inward than the widened sections in the width direction.

In this case, weights of the leading ends of the vibrating arm sections increase by providing the widened sections in the leading ends of the vibrating arm sections and, as a result, it is possible to decrease the frequency of the piezoelectric vibrating piece. Generally, if the size of the piezoelectric vibrating piece is reduced, the frequency is increased by shortening the entire length of the vibrating arm sections and then a desired frequency cannot be obtained, but it is possible to decrease the frequency by increasing the weights of the leading ends of the vibrating arm sections, even if the size of the piezoelectric vibrating piece is reduced. Further, it is possible to prevent an increase in the width dimension of the package by positioning the leading ends of the convex sections inward than the widened sections.

According to another aspect of the invention, there is provided a piezoelectric vibrator including: the piezoelectric vibrating piece according to the aspect of the invention described above; and a package that accommodates the piezoelectric vibrating piece, in which electrode pads formed on a base substrate of the package is electrically connected to mount electrodes formed in the support arm section.

In this case, it is possible to provide the piezoelectric vibrator having high accuracy, which is capable of obtaining a stable and desired frequency by accommodating the piezoelectric vibrating piece capable of reducing the vibration leakage effectively within the package.

According to still another aspect of the invention, there is provided an oscillator in which the piezoelectric vibrator described above is electrically connected to an integrated circuit as a resonator.

According to still another aspect of the present invention, there is provided an electronic apparatus in which the piezoelectric vibrator described above is electrically connected to a timer section.

According to still another aspect of the present invention, there is provided a radio controlled timepiece in which the piezoelectric vibrator described above is electrically connected to a filter section.

In the oscillator, the electronic apparatus and the radio controlled timepiece, it is possible to improve performance by providing the piezoelectric vibrator described above.

According to the aspect of the invention, it is possible to provide the piezoelectric vibrating piece capable of suppressing the vibration leakage to the side of the package in the mount section of the piezoelectric vibrating piece as much as possible, the piezoelectric vibrator, the oscillator, the electronic apparatus and the radio controlled timepiece.

DETAILED DESCRIPTION OF THE PREFERRED EMBODIMENTS

Figure 1:
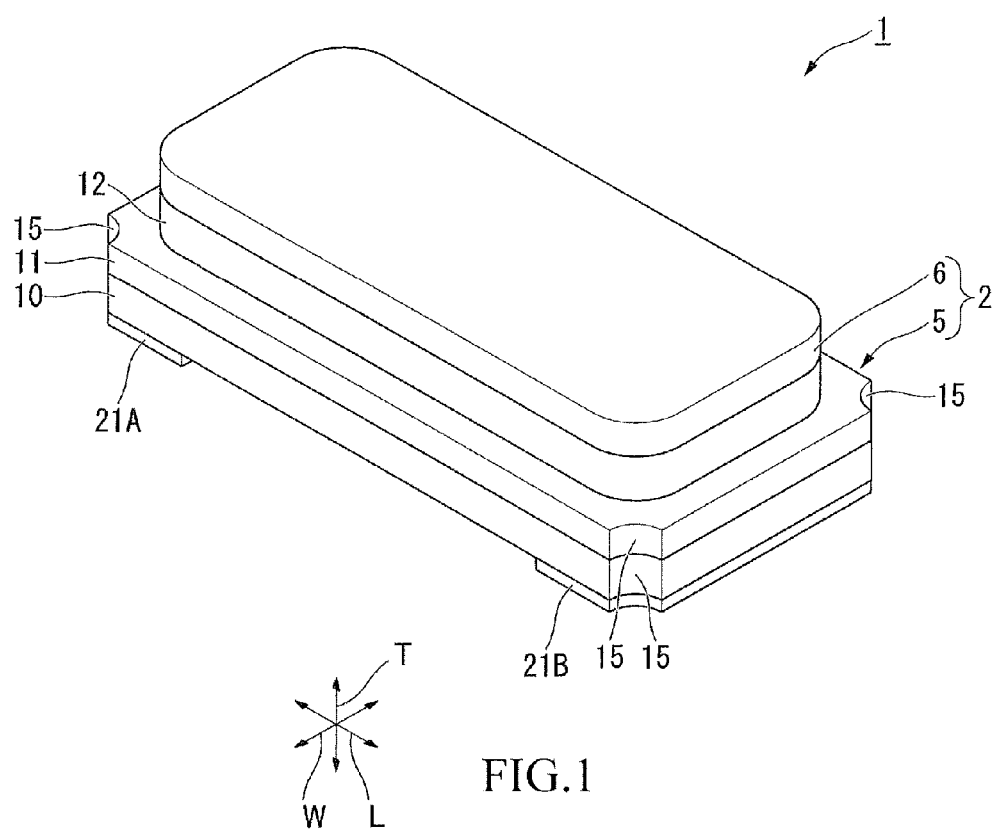
FIG. 1 is an external perspective view of a piezoelectric vibrator according to a first embodiment of the invention.
Figure 2:
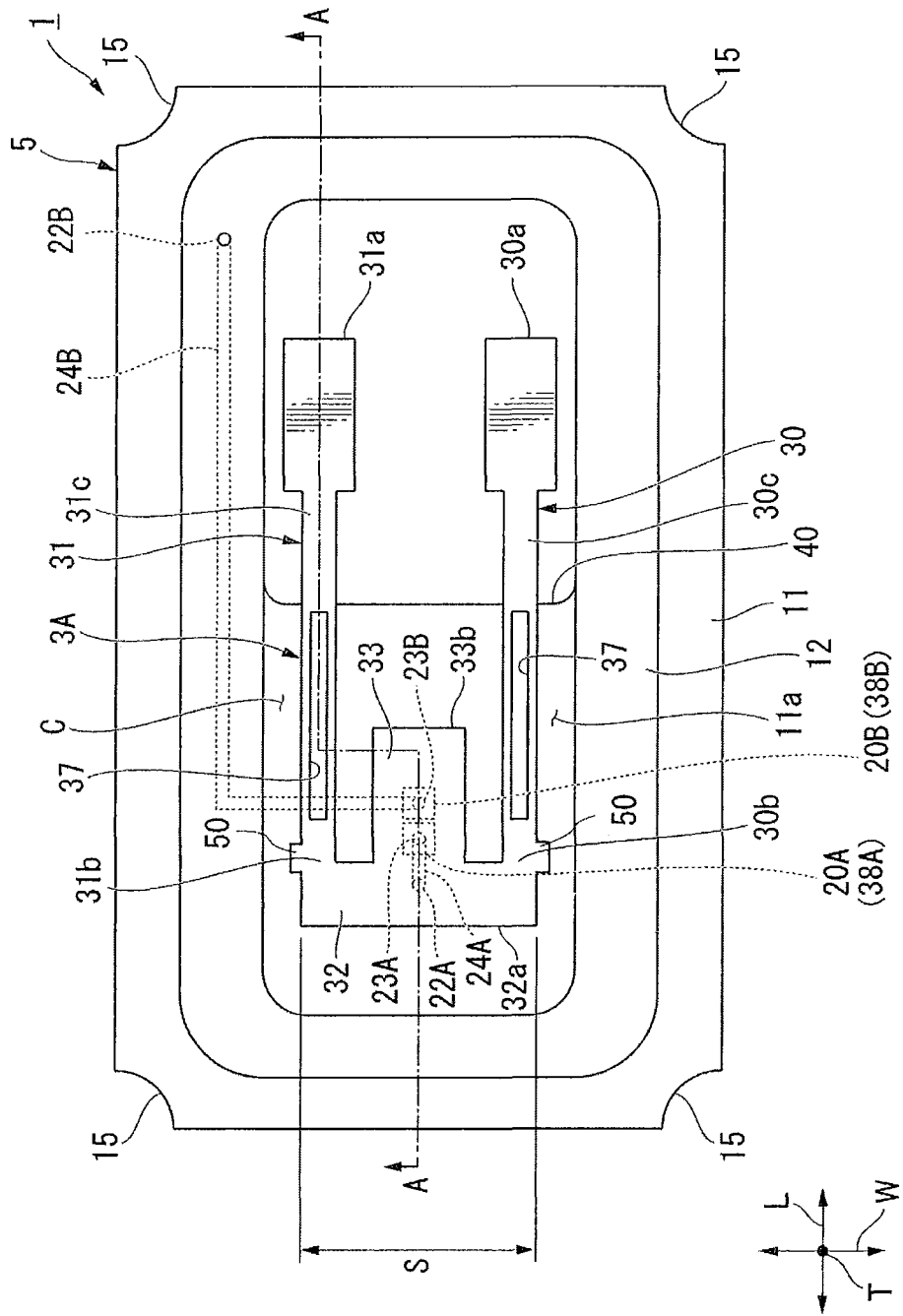
FIG. 2 is an internal configuration view of the piezoelectric vibrator illustrated in FIG. 1 and a view of a piezoelectric vibrating piece viewed from above in a state where a sealing plate is removed.
Figure 3:
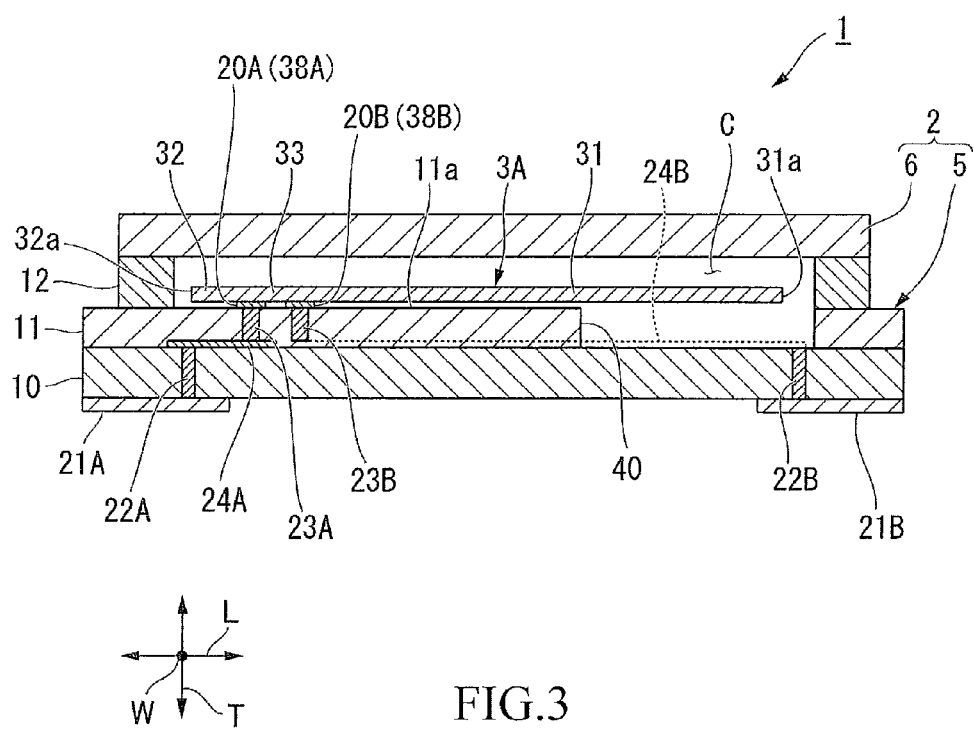
FIG. 3 is a cross-sectional view of the piezoelectric vibrator taken along line A-A in FIG. 2.
Figure 4:
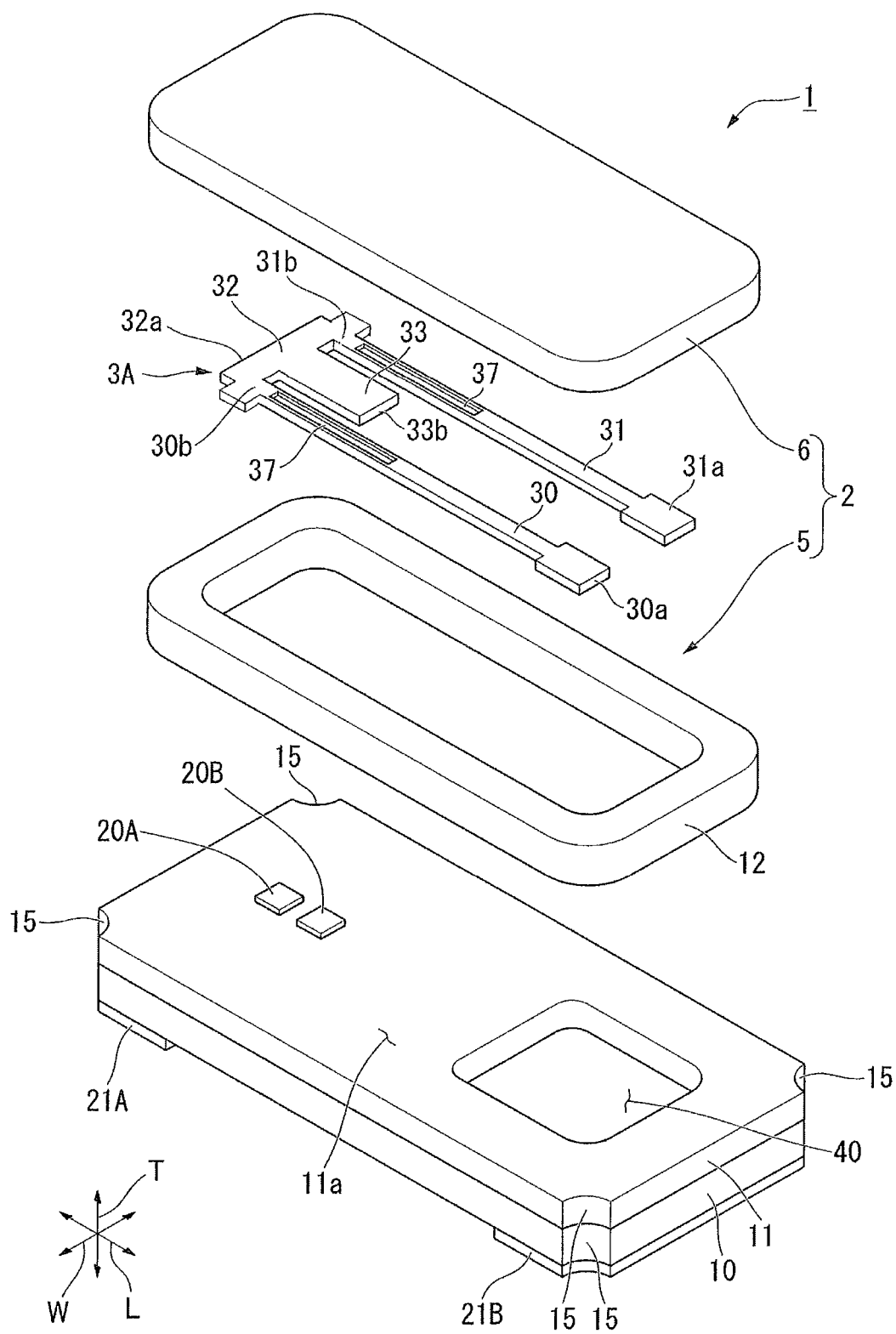
FIG. 4 is an exploded perspective view of the piezoelectric vibrator illustrated in FIG. 1.

Hereinafter, embodiments of the invention will be described with reference to the drawings.

Embodiments

Configuration of Piezoelectric Vibrator

As illustrated in FIGS. 1 to 4, a piezoelectric vibrator 1 of the embodiment is a surface mounting vibrator of a ceramic package type including a package 2 having a cavity C that is hermetically sealed on the inside thereof and a tuning fork type piezoelectric vibrating piece 3A accommodated in the cavity C.

The piezoelectric vibrator 1 is formed in a substantially rectangular parallelepiped shape and a longitudinal direction of the piezoelectric vibrator 1 is referred to as a length direction L, a short direction is referred to as a width direction W, and a direction orthogonal to the length direction L and the width direction W is referred to as a thickness direction T in a plan view in the embodiment.

The package 2 includes a package body 5 and a sealing plate 6 that is bonded to the package body 5 and forms the cavity C between the package body 5 and the sealing plate 6.

The package body 5 includes a first base substrate 10 and a second base substrate 11 bonded to each other in a state of being mutually superimposed, and a seal ring 12 bonded on the second base substrate 11.

The first base substrate 10 is a substrate made of ceramic formed in a substantially rectangular shape in a plan view. The second base substrate 11 is a substrate that is made of ceramic formed in a substantially rectangular shape in a plan view having the same external shape as that of the first base substrate 10, and is integrally bonded to the first base substrate 10 by sintering or the like in a state of being superimposed on the first base substrate 10.

A cutout section 15 having a quarter-circle shape in a plan view is formed throughout an entirety of both the substrates 10 and 11 in the thickness direction T in four corners of the first base substrate 10 and the second base substrate 11. The first base substrate 10 and the second base substrate 11 are produced by, for example, superimposing and bonding two sheets of wafer-shaped ceramic substrates, and forming a plurality of through holes which pass through the two ceramic substrates in a matrix shape, and then cutting the two ceramic substrates into a grid pattern, based on each through hole. At this time, the cutout section 15 is formed by dividing the through hole into four sections.

In addition, an upper surface of the second base substrate 11 is a mounting surface 11a corresponding to an internal wall on which the piezoelectric vibrating piece 3A is mounted.

Moreover, the first base substrate 10 and the second base substrate 11 are made of ceramic and, for example, a particular ceramic material may be High Temperature Co-Fired Ceramic (HTCC) made of alumina or Low Temperature Co-Fired Ceramic (LTCC) made of glass ceramic or the like.

The seal ring 12 is a conductive frame-shaped member that is slightly smaller than the external shape of the first base substrate 10 and the second base substrate 11, and is bonded to the mounting surface 11a of the second base substrate 11.

Particularly, the seal ring 12 is bonded to the mounting surface 11a by baking with a brazing material such as silver brazing, a solder material or the like, or is bonded to a metal bond layer formed on the mounting surface 11a by welding or the like (for example, by vapor depositing or sputtering or the like in addition to electroplating or electroless plating).

Moreover, for example, a material of the seal ring 12 includes nickel-based alloys or the like and, particularly, may be selected from Kovar, Elinvar, Invar, 42-Alloy or the like. Particularly, a material of the seal ring 12 is preferably selected from a material having a coefficient of thermal expansion similar to that of the first base substrate 10 and the second base substrate 11 made of ceramic. For example, as the first base substrate 10 and the second base substrate 11, if alumina having the coefficient of thermal expansion of 6.8×$10^{-6}$/° C. is used, Kovar having the coefficient of thermal expansion of 5.2×$10^{-6}$/° C. or 42-Alloy having the coefficient of thermal expansion of 4.5 to 6.5×$10^{-6}$/° C. is preferably used as the seal ring 12.

The sealing plate 6 is a conductive substrate superimposed on the seal ring 12 and is hermetically bonded to the package body 5 by bonding to the seal ring 12. Then, a space defined by the sealing plate 6, the seal ring 12 and the mounting surface 11a of the second base substrate 11 serves as the cavity C which is hermetically sealed.

Moreover, for example, a welding method of the sealing plate 6 may include seam welding by contact of a roller electrode, laser welding, ultrasonic welding or the like. In addition, in order to reliably perform the welding between the sealing plate 6 and the seal ring 12, bonding layers of nickel, metal and the like which are compatible with each other are preferably formed at least on a lower surface of the sealing plate 6 and an upper surface of the seal ring 12, respectively.

However, a pair of electrode pads 20A and 20B which are connection electrodes connected to the piezoelectric vibrating piece 3A are formed on the mounting surface 11a of the second base substrate 11 at an interval in the length direction L, and a pair of external electrodes 21A and 21B are formed on a lower surface of the first base substrate 10 at an interval in the length direction L.

For example, the electrode pads 20A and 20B, and the external electrodes 21A and 21B are single-layer films of a single metal or a laminated film of different laminated metals formed by vapor depositing, sputtering or the like, and are electrically connected to each other.

Detailed description will be made on this point.

A first penetration electrode 22A of one side, which is electrically connected to the external electrode 21A of one side and passes through the first base substrate 10 in the thickness direction T, is formed in the first base substrate 10, and a second penetration electrode 23A of one side, which is electrically connected to the electrode pad 20A of one side and passes through the second base substrate 11 in the thickness direction T, is formed in the second base substrate 11. Then, a connection electrode 24A of one side that connects the first penetration electrode 22A of one side and the second penetration electrode 23A of one side is formed between the first base substrate 10 and the second base substrate 11. Therefore, the electrode pad 20A of one side and the external electrode 21A of one side are electrically connected to each other.

In addition, a first penetration electrode 22B of the other side, which is electrically connected to the external electrode 21B of the other side and passes through the first base substrate 10 in the thickness direction T, is formed in the first base substrate 10, and a second penetration electrode 23B of the other side, which is electrically connected to the electrode pad 20B of the other side and passes through the second base substrate 11 in the thickness direction T, is formed in the second base substrate 11. Then, a connection electrode 24B of the other side that connects the first penetration electrode 22B of the other side and the second penetration electrode 23B of the other side is formed between the first base substrate 10 and the second base substrate 11. Therefore, the electrode pad 20B of the other side and the external electrode 21B of the other side are electrically connected to each other.

Moreover, the connection electrode 24B of the other side is, for example, patterned so as to extend under the seal ring 12 along the seal ring 12 to avoid a concave section 40 which is described below.

The concave section 40 is formed in a portion facing leading ends 30a and 31a of a pair of vibrating arm sections 30 and 31 of the piezoelectric vibrating piece 3A described below in the mounting surface 11a of the second base substrate 11. The concave section 40 is formed to avoid contact with the leading ends 30a and 31a of the vibrating arm sections 30 and 31 if the vibrating arm sections 30 and 31 are displaced (bending deformed) in the thickness direction T due to influence of impact by dropping or the like. The concave section 40 is a through hole passing through the second base substrate 11 and is formed in a square shape in a plan view having four round corners on the inside of the seal ring 12.

Piezoelectric Vibrating Piece

The piezoelectric vibrating piece 3A described above is a tuning fork type vibrating piece formed from a piezoelectric material such as crystal, lithium tantalate or lithium niobate. The piezoelectric vibrating piece 3A includes the pair of vibrating arm sections 30 and 31 extending along each other in the length direction L; a base section 32 that is connected to each of base ends 30b and 31b of the pair of vibrating arm sections 30 and 31, and extends in the width direction W; and a support arm section 33 that is connected to the base section 32 between the pair of vibrating arm sections 30 and 31, and extends along the vibrating arm sections 30 and 31 from the base section 32. Moreover, the shape of the piezoelectric vibrating piece 3A is not limited to the embodiment and, for example, the shape thereof may be formed such that the vibrating arm sections 30 and 31 extend by being inclined approximately 5 degrees at the maximum in the length direction L. That is, the shape of the piezoelectric vibrating piece 3A is not specifically limited as long as the vibrating arm sections 30 and 31 are provided at a distance away from each other in the width direction W of the base section, and the support arm section 33 is provided therebetween.

The pair of vibrating arm sections 30 and 31 are a hammerhead type in which widened sections 30a and 31a that are wider in the width dimensions compared to the side of the base ends 30b and 31b are provided in the leading end sections, and a weight and moment of inertia when vibrating on the side of the widened sections 30a and 31a of the vibrating arm sections 30 and 31 are higher. Therefore, it is possible to reduce the resonance frequency of the piezoelectric vibrating piece 3A even if the length of the vibrating arm sections 30 and 31 is shortened and the size thereof is reduced.

Moreover, the pair of vibrating arm sections 30 and 31 are not limited to the hammerhead type.

Each of the pair of vibrating arm sections 30 and 31 includes a groove section 37 formed along the longitudinal direction (an extending direction) of the vibrating arm sections 30 and 31 on both main surfaces 30c and 31c thereof.

The groove sections 37 are, for example, formed from the side of the base ends 30b and 31b of the vibrating arm sections 30 and 31 to a portion approximately near the center thereof. Since electric field efficiency is improved in the vibrating arm sections 30 and 31 by forming the groove section 37, it is possible to decrease the power consumption of the piezoelectric vibrating piece 3A. In addition, the shape of the piezoelectric vibrating piece 3A is not limited to the embodiment and may be a type in which the groove section 37 is not formed.

The pair of vibrating arm sections 30 and 31 include a weight metal film (not illustrated) coated on an outer surface for adjusting a frequency so that vibration states of themselves are adjusted to be vibrated within a predetermined frequency range.

The weight metal film (not illustrated) includes, for example, a rough adjustment film (not illustrated) for roughly adjusting the frequency and a fine adjustment film (not illustrated) for finely adjusting the frequency.

The adjustment of the frequency is performed by the weight adjustment of the rough adjustment film and the fine adjustment film, and the frequency of the pair of vibrating arm sections 30 and 31 is adjusted so as to fall within a predetermined target frequency.

Figure 5A:
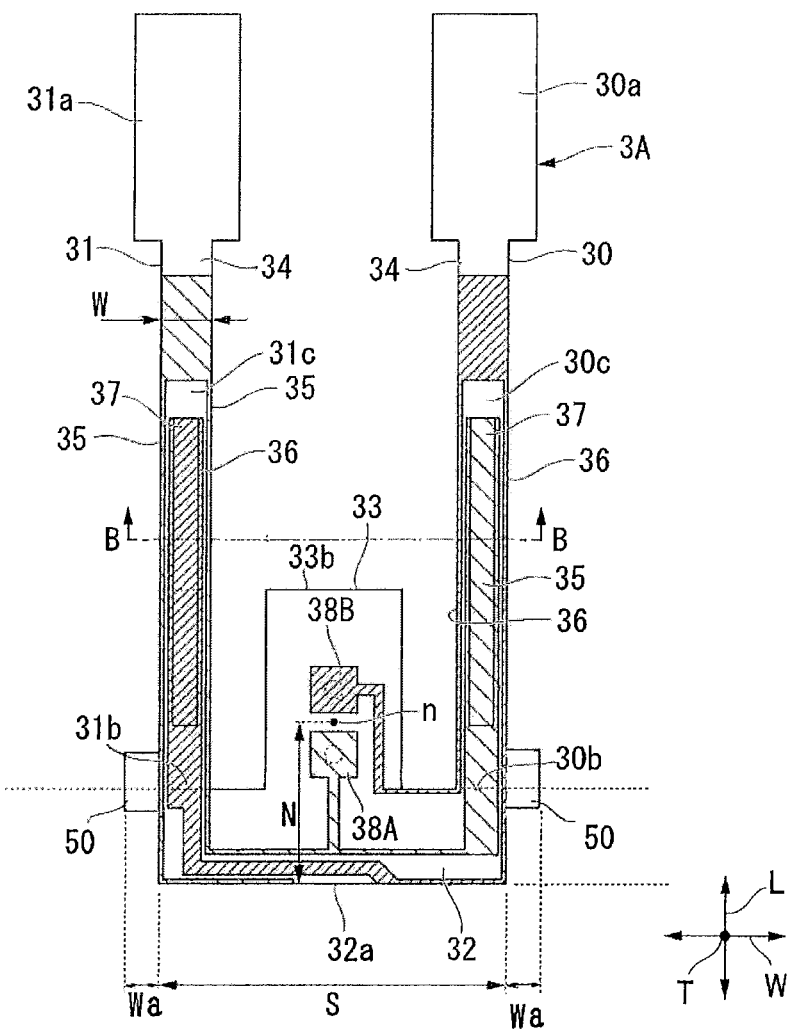
FIG. 5A is a top plan view of the piezoelectric vibrating piece according to the first embodiment and FIG. 5B is a cross-sectional view taken along line B-B in FIG. 5A.
Figure 5B:
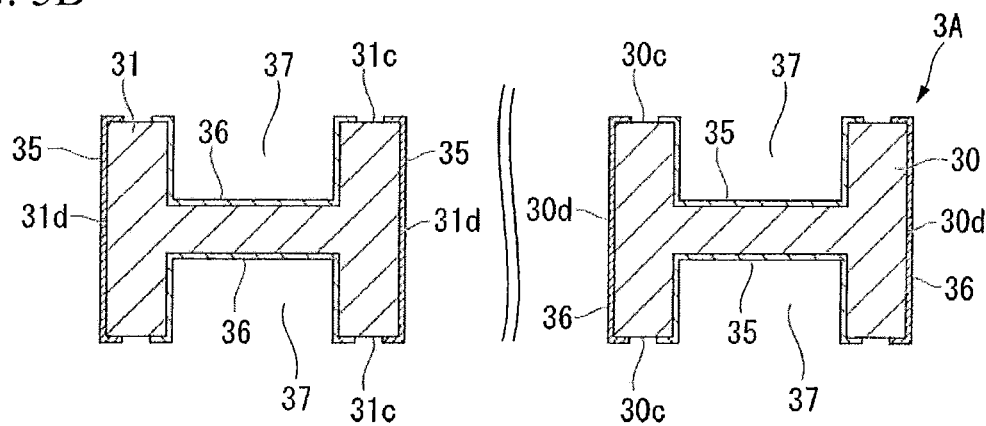

In addition, as illustrated in FIGS. 5A and 5B, the pair of vibrating arm sections 30 and 31 include excitation electrodes formed of a first excitation electrode 35 and a second excitation electrode 36 which vibrate the pair of vibrating arm sections 30 and 31 on a surface thereof.

The excitation electrodes formed of the first excitation electrode 35 and the second excitation electrode 36 are patterned in a state of being electrically insulated with respect to each other on an outer surface of the pair of vibrating arm sections 30 and 31, and vibrate the pair of vibrating arm sections 30 and 31 with a predetermined frequency in a direction separating from or approaching each other.

More particularly, as illustrated in FIGS. 5A and 5B, for example, the first excitation electrode 35 is continuously provided mainly on the groove section 37 of the vibrating arm section 30 and on both side surfaces 31d of the vibrating arm section 31 along the length direction L that is the extending direction of the vibrating arm sections 30 and 31, respectively. Further, the second excitation electrode 36 is continuously provided mainly on both side surfaces 30d of the vibrating arm section 30 and on the groove section 37 of the vibrating arm section 31 along the length direction L that is the extending direction of the vibrating arm sections 30 and 31, respectively.

A pair of mount electrodes 38A and 38B are provided on the outer surface of the support arm section 33 as mount sections when mounting the piezoelectric vibrating piece 3A. The mount electrode 38A of one side is formed by being continuously patterned to the first excitation electrode 35 described above, and the mount electrode 38B of the other side is formed by being continuously patterned to the second excitation electrode 36 described above.

The mount electrodes 38A and 38B are capable of feeding power from the external electrodes 21A and 21B to the first excitation electrode 35 and the second excitation electrode 36 by being electrically connected to the electrode pads 20A and 20B when mounting the piezoelectric vibrating piece 3A.

The piezoelectric vibrating piece 3A configured as described above is mounted so that the pair of mount electrodes 38A and 38B come into contact with the pair of electrode pads 20A and 20B through a metal bump, a conductive adhesive (not illustrated) or the like. Therefore, the piezoelectric vibrating piece 3A is supported by the support arm section 33 in a state of being floated from the mounting surface 11a of the second base substrate 11, and the side of the base ends 30b and 31b of the pair of vibrating arm sections 30 and 31 is supported through the base section 32 in a cantilever manner. In addition, the piezoelectric vibrating piece 3A is in a state where the pair of mount electrodes 38A and 38B are electrically connected to the pair of electrode pads 20A and 20B, respectively.

Then, when applying a predetermined voltage to the external electrodes 21A and 21B, a current flows to the pair of excitation electrodes 35 and 36, and the pair of vibrating arm sections 30 and 31 vibrate with a predetermined resonance frequency in the direction separating from or approaching each other (the width direction W) by interaction of the excitation electrodes 35 and 36 with each other.

The vibration of the pair of vibrating arm sections 30 and 31 is used as a time source, a timing source of a control signal, a reference signal source or the like.

Here, the piezoelectric vibrating piece 3A of the embodiment is characterized in that convex sections 50 are formed continuous with side surfaces of roots of the vibrating arm sections 30 and 31, and the side surfaces of the base section 32. As illustrated in FIGS. 5A and 5B, a shape of the convex section 50 may be substantially rectangular and may be substantially square, polygonal or the like. The convex sections 50 are integrally formed with the piezoelectric vibrating piece 3A and may be formed so as to include boundaries between the vibrating arm sections 30 and 31, and the base section 32.

It is possible to absorb and consume the vibration in the convex sections 50 by forming the convex sections 50, in the process that the vibration generated in the vibrating arm sections 30 and 31 is transmitted (leaked) to the base section 32. That is, it is possible to further reduce the vibration leakage that is transmitted from the base section 32 to the support arm section 33 and that is leaked to the side of the package.

Moreover, forming regions of the convex sections 50 in the longitudinal direction (the L direction of FIGS. 5A and 5B) of the piezoelectric vibrating piece 3A are preferably regions continuous with the side surfaces of the roots of the vibrating arm sections 30 and 31, and the side surfaces of the base section 32, that is, so as to include the boundaries between the vibrating arm sections 30 and 31, and the base section 32. For example, in a case where a length of the convex section 50 in the longitudinal direction is 65 μm, if the convex sections 50 are formed only on the side surfaces of the roots of the vibrating arm sections 30 and 31, the frequency of the piezoelectric vibrating piece 3A is remarkably increased due to an extreme increase in the rigidity of the roots of the vibrating arm sections 30 and 31. According to simulations carried out by the inventors, it is recognized that if the convex sections 50 (the length in the longitudinal direction is 65 μm) described above are formed only on the side surfaces of the roots of the vibrating arm sections 30 and 31, the frequency (in a non-mount) increases to 33.885 kHz while the convex sections 50 are not formed, the frequency (in the non-mount) of the piezoelectric vibrating piece 3A is 32.489 kHz. In this case, even if an effect of the reduction of the vibration leakage can be expected by providing the convex sections 50, since a desired frequency is unlikely to be output, it is not practical.

Further, if the convex sections 50 described above are provided only on the side surfaces of the base section 32, it is recognized that an effect of remarkable reduction of the vibration leakage is not expected. According to the simulations carried out by the inventors, it is recognized that if the convex sections 50 described above are formed only on the side surfaces of the base section 32, a difference ($\Delta F$) in the frequency of $-0.111$ kHz between the non-mount and the mount occurs, and a value ($\Delta F/F$) obtained by dividing the frequency in the non-mount is $-3.361$ (ppm). Since the absolute value of $\Delta F/F$ is preferably 3.0 (ppm) or less to have an effect of remarkable reduction of the vibration leakage, that is, even if the convex sections 50 are formed only in the base section 32, the effect of a desired level is not obtained.

On the other hand, in the case where the convex sections 50 described above are formed in the region continuous with the side surfaces of the roots of the vibrating arm sections 30 and 31, and the side surfaces of the base section 32, it is recognized that the degree of increase in the frequency is low and the effect of further remarkable reduction of the vibration leakage is obtained compared to the case where the convex sections 50 are provided only in the vibrating arm sections 30 and 31. According to the simulations carried out by the inventors, it is recognized that the difference ($\Delta F$) in the frequency between the mount and the non-mount is as low as 0.015 kHz, and $\Delta F/F$ is 0.457 (ppm) when dividing the difference thereof by the frequency in the non-mount. That is, according to the configuration, the frequencies in the mount and the non-mount are barely changed, and the vibration leakage practically does not occur.

Moreover, in the case where the convex sections 50 described above are formed in the region continuous with the side surfaces of the roots of the vibrating arm sections 30 and 31, and the side surfaces of the base section 32, a dimension of the convex section 50 in the longitudinal direction may be a length of approximately 80% or more and 200% or less with respect to an arm width W of the vibrating arm sections 30 and 31, and, at this time, a center line extending in the width direction of the convex sections 50 may be on the lower side from the boundary between the vibrating arm sections 30 and 31, and the base section 32. As described above, this is because the frequency of the piezoelectric vibrating piece 3A increases, if nearly all of the convex sections 50 are on the side surface of the vibrating arm sections 30 and 31.

Further, in the embodiment, electrode films are not formed on the surfaces of the convex sections 50, but the electrodes may be formed to pass through the surfaces of the convex sections 50. Further, the thickness of the convex sections 50 is substantially the same as that of the vibrating arm sections 30 and 31, but the thickness thereof is not limited to the embodiment.

Next, the width dimension of the convex sections 50 is described. As described above, if the convex sections 50 are provided in the region continuous with the side surfaces of the roots of the vibrating arm sections 30 and 31, and the side surfaces of the base section 32, the effect of the reduction of the vibration leakage is obtained, but it is recognized that a further remarkable effect is obtained by setting the dimension of the convex section 50 in the width direction (the W direction of FIGS. 5A and 5B) as below. That is, when the maximum length of the convex section 50 in the width direction is Wa and the arm width of the vibrating arm sections 30 and 31 is W, it is possible to more effectively reduce the vibration leakage if a relationship of $0.2 \times W \leq Wa \leq 1.4 \times W$ is satisfied.

Figure 6:
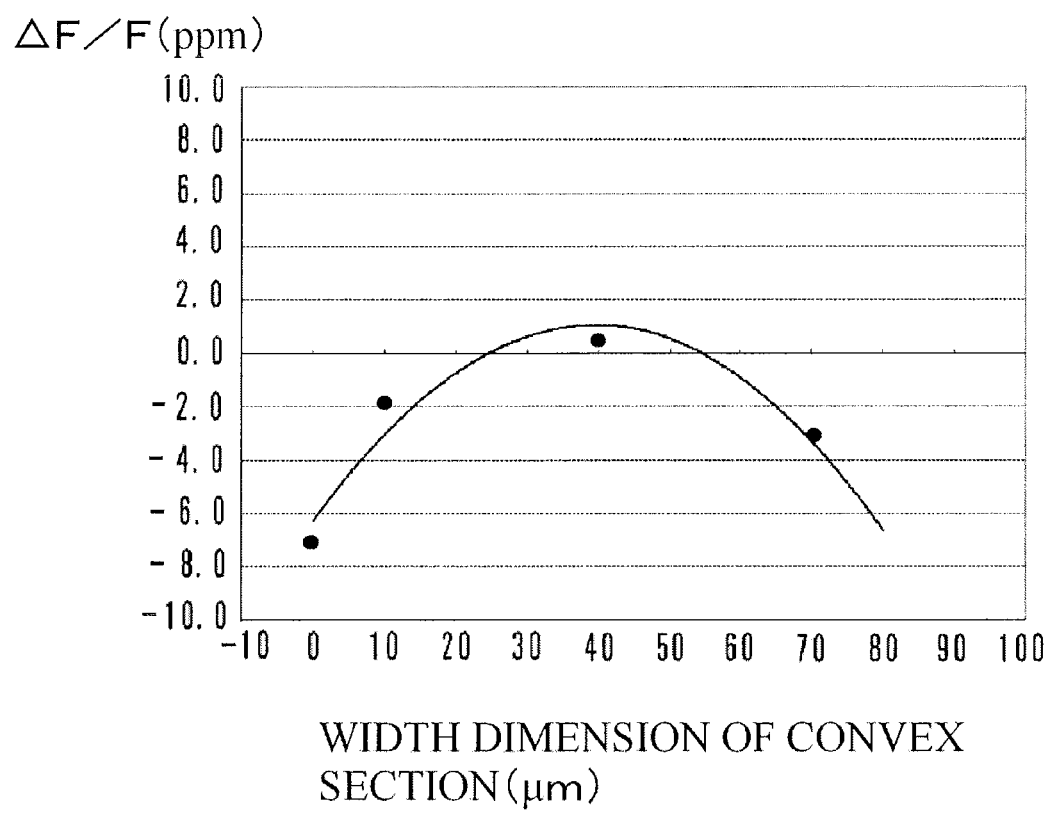
FIG. 6 is a view illustrating a relationship between a width (μm) of a convex section and a ratio (ΔF/F) of a change in a frequency.

FIG. 6 illustrates simulation results of the width dimension (μm) of the convex sections 50 and a ratio (ΔF/F) (the unit is ppm) of the change in the frequency. Here ΔF/F is a value obtained by dividing the difference (ΔF) in the frequency in the mount of the piezoelectric vibrating piece and in the non-mount thereof, respectively, by the frequency (F) in the non-mount. Further, in the simulations, the arm width W (μm) of the vibrating arm sections 30 and 31 is 50 μm.

According to the simulation results, it is recognized that in order to suppress the absolute value (ppm) of the ratio (ΔF/F) of the change in the frequency to approximately 3.0 or less, it is necessary for the width dimension of the convex sections 50 to be 10 μm or more and 70 μm or less. When dividing this by the arm width W (μ) of the vibrating arm sections 30 and 31, $0.2 \times W \leq Wa \leq 1.4 \times W$. Further, it is recognized that the relationship is not substantially changed even if the arm width W of the vibrating arm sections 30 and 31 is a value other than 50 μm. Therefore, the width dimension Wa (μm) of the convex sections 50 is set to satisfy the relationship of $0.2 \times W \leq Wa \leq 1.4 \times W$.

Moreover, in the embodiment, the arm width W of the vibrating arm sections 30 and 31 is approximately 50 μm but the dimension of the arm width W is not limited to the embodiment and may be a dimension other than the embodiment.

Further, the width dimension of the convex sections 50 may be determined from the viewpoint of size reduction. That is, leading ends of the convex sections 50 may be positioned inside the widened sections 30a and 31a of the leading ends of the vibrating arm sections 30 and 31. If the leading ends of the convex sections 50 exist outside the widened sections 30a and 31a, the portions may come into contact with the inner wall of the package. Further, since a clearance with the package is small, positioning is difficult when mounting the piezoelectric vibrating piece 3A on the package.

Moreover, in the embodiment described above, the dimensions of the configurations are not limited to the illustrated dimensions and it is also possible to form configurations in other appropriate dimensions. Further, the mount region of the base section 32 may be formed so as to include the position of the center of gravity of the piezoelectric vibrating piece 3A.

Another Embodiment

Oscillator

Next, an embodiment of an oscillator according to the invention is described with reference to FIG. 7.

Figure 7:
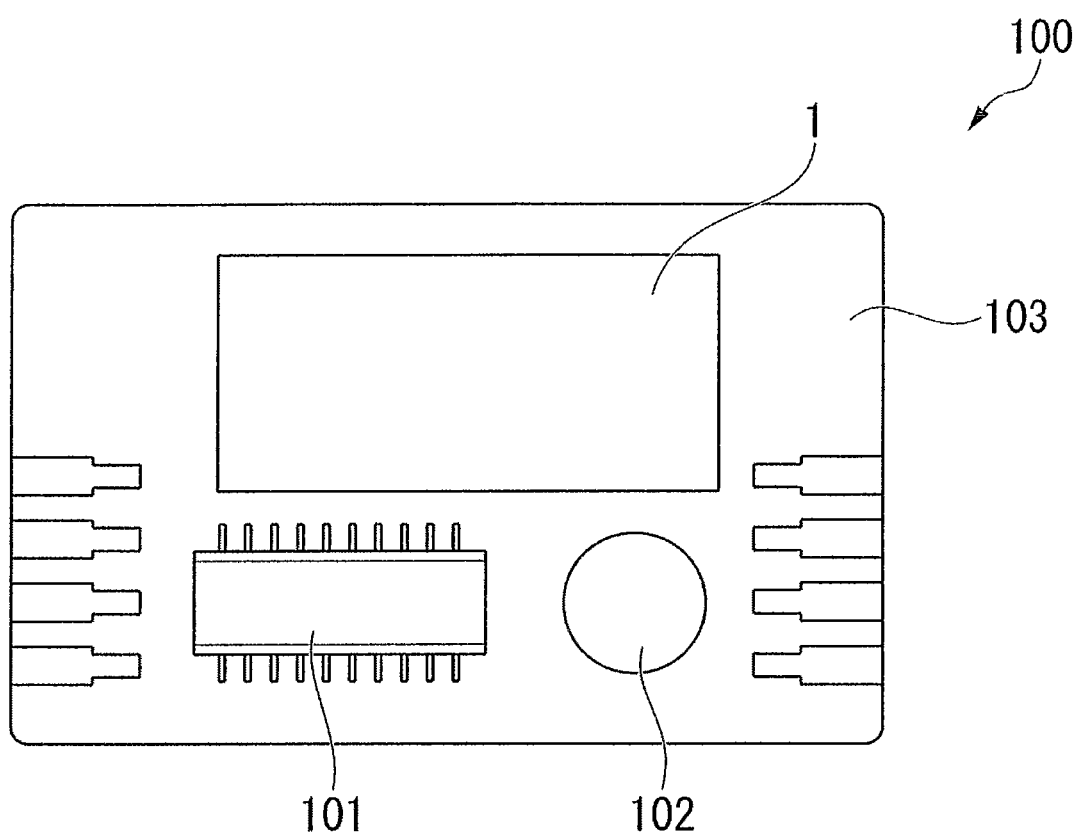
FIG. 7 is a configuration view illustrating an oscillator according to the invention.

As illustrated in FIG. 7, an oscillator 100 according to the embodiment is configured as a resonator in which the piezoelectric vibrator 1 illustrated in any one of the first to third embodiments described above is electrically connected to an integrated circuit 101. Here, the piezoelectric vibrator 1 includes the piezoelectric vibrating piece illustrated in the first embodiment.

The oscillator 100 includes a substrate 103 on which an electronic part 102 such as a capacitor is mounted. The integrated circuit 101 described above for the oscillator is mounted on the substrate 103 and the piezoelectric vibrator 1 is mounted in the vicinity of the integrated circuit 101. The electronic part 102, the integrated circuit 101 and the piezoelectric vibrator 1 are electrically connected to each other by a wiring pattern (not illustrated). Moreover, each of the configuration parts is molded by a resin (not illustrated).

In the oscillator 100 configured as described above, if a voltage is applied to the piezoelectric vibrator 1, the piezoelectric vibrating piece vibrates in the piezoelectric vibrator 1. The vibration is converted into an electric signal by piezoelectric characteristics of the piezoelectric vibrating piece and is input into the integrated circuit 101 as an electric signal. Various types of processing are performed by the integrated circuit 101 on the input electric signal and the electric signal is output as a frequency signal. Therefore, the piezoelectric vibrator 1 functions as the resonator.

In addition, it is possible to add functions for controlling an operation date and time or for supplying time and a calendar for an apparatus or an external apparatus in addition to a single-function oscillator for a timepiece or the like to the configuration of the integrated circuit 101 by selectively setting a real time clock (RTC) module or the like upon request.

As described above, according to the oscillator 100 of the embodiment, it is possible to provide the oscillator 100 which can effectively suppress the vibration leakage similar to the above embodiments by including the piezoelectric vibrator 1 described above.

Another Embodiment

Electronic Apparatus

Figure 8:
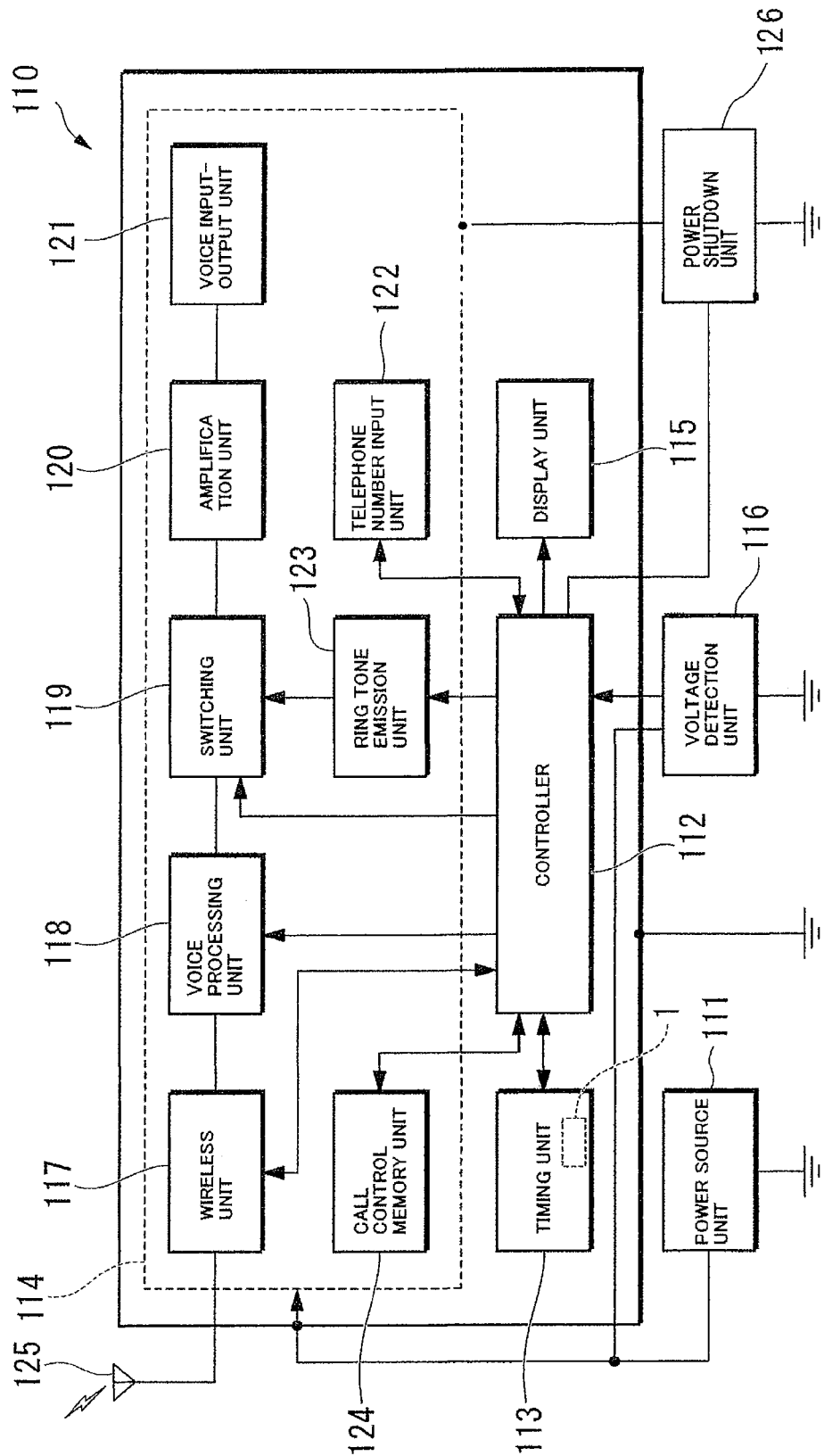
FIG. 8 is a configuration view illustrating an electronic apparatus according to the invention.

Next, an embodiment of an electronic apparatus according to the invention is described with reference to FIG. 8. Moreover, as an example of the electronic apparatus, a portable information apparatus (electronic apparatus) 110 having the piezoelectric vibrator 1 illustrated in any one of the first to third embodiments described above is described. Here, the portable information apparatus 110 includes the piezoelectric vibrating piece illustrated in the first embodiment.

Here, the portable information apparatus 110 according to the embodiment is represented, for example, by a cellular phone, and develops and improves a wristwatch of the related art. An outer appearance thereof is similar to the wristwatch and a liquid crystal display is arranged in a portion corresponding to a dial, and a current time or the like can be displayed on a screen. In addition, in a case of being used as a communication apparatus, it is possible to perform the communication similar to the cellular phone of the related art by removing the wristwatch from the wrist and by using a speaker and a microphone which are incorporated in the inner portion of a band. However, the portable information apparatus can be significantly downsized and made lightweight compared to the cellular phone of the related art.

Next, a configuration of the portable information apparatus 110 of the embodiment is described. As illustrated in FIG. 8, the portable information apparatus 110 includes the piezoelectric vibrator 1 and a power supply section 111 for supplying electric power. For example, the power supply section 111 is formed of a lithium secondary battery. A controller 112 that performs various types of control, a timer section 113 that counts the time or the like, a communication section 114 that performs the communication with the outside, a display section 115 that displays various types of information, and a voltage detecting section 116 that detects the voltage of each of function sections are connected in parallel to the power supply section 111. Then, power can be supplied to each of the function sections by the power supply section 111.

The controller 112 performs operational control of the entirety of the system such as transmitting and receiving of sound data, measuring or displaying of a current time or the like by controlling each of the function sections. In addition, the controller 112 includes a ROM in which a program is written in advance, a CPU that reads and executes the program written on the ROM, a RAM that is used as a work area of the CPU or the like.

The timer section 113 includes an integrated circuit incorporating an oscillator circuit, a register circuit, a counter circuit, an interface circuit or the like, and the piezoelectric vibrator 1. If voltage is applied to the piezoelectric vibrator 1, the piezoelectric vibrating piece vibrates, the vibration is converted into an electric signal by the piezoelectric characteristics of the crystal and is input into the oscillator circuit as the electric signal. The output of the oscillator circuit is binarized and is counted by the register circuit and the counter circuit. Then, the signal is transmitted to and received from the controller 112 through the interface circuit and the current time, the current date, the calendar information or the like is displayed on the display section 115.

The communication section 114 has the same function as the cellular phone of the related art and includes a radio section 117, a voice processing section 118, a switching section 119, an amplifier 120, a voice input and output section 121, a phone number input section 122, a ring sound generator 123, and a call control memory section 124.

The radio section 117 transmits and receives various data such as voice data to/from a base station through an antenna 125. The voice processing section 118 codes and decodes the voice signal input from the radio section 117 or the amplifier 120. The amplifier 120 amplifies the signal input from the voice processing section 118 or the voice input and output section 121 to a predetermined level. The voice input and output section 121 is configured of a speaker, a microphone or the like, and amplifies the ring sound or reception voice, or collects sound.

In addition, the ring sound generator 123 generates the ring sound in response to a call from the base station. The switching section 119 switches the amplifier 120 connected to the voice processing section 118 into the ring sound generator 123 only when a call is received. Therefore, the ring sound generated in the ring sound generator 123 is output to the voice input and output section 121 through the amplifier 120.

Moreover, the call control memory section 124 stores a program relating to incoming and outgoing call control of the communication. In addition, the phone number input section 122 includes, for example, number keys from 0 to 9 along with other keys, and the phone number of a call destination is input by pressing the number keys.

If the voltage applied to each of the function sections such as the controller 112 by the power supply section 111 is below a predetermined value, the voltage detecting section 116 detects the voltage drop and notifies the controller 112. At this time, the predetermined voltage value is a value that is set in advance as a minimum voltage required to stably operate the communication section 114 and, for example, is approximately 3 V. The controller 112 which receives the voltage drop notification from the voltage detecting section 116 prohibits operations of the radio section 117, the voice processing section 118, the switching section 119 and the ring sound generator 123. Particularly, stopping of the operation of the radio section 117 in which power consumption is great is essential. Furthermore, the fact that the communication section 114 cannot be used due to a deficiency of the battery power is displayed on the display section 115.

That is, the operation of the communication section 114 is prohibited by the voltage detecting section 116 and the controller 112, and the fact can be displayed on the display section 115. The display may be a text message and may be a x (cross) mark on a phone icon displayed in an upper portion of a display surface of the display section 115 as a more intuitive display.

Moreover, it is possible to further reliably stop the function of the communication section 114 by including a power shutdown section 126 capable of selectively cutting the power source of a portion according to the function of the communication section 114.

As described above, according to the portable information apparatus 110 of the embodiment, it is possible to provide the portable information apparatus 110 which can effectively suppress the vibration leakage similar to the above embodiments by including the piezoelectric vibrator 1 described above.

Another Embodiment

Radio Controlled Timepiece

Next, an embodiment of a radio controlled timepiece according to the invention is described with reference to FIG. 9. As an example of the radio controlled timepiece, a radio controlled timepiece 130 having the piezoelectric vibrator 1 illustrated in any one of the first to third embodiments described above is described. Here, the radio controlled timepiece 130 includes the piezoelectric vibrating piece illustrated in the first embodiment.

Figure 9:
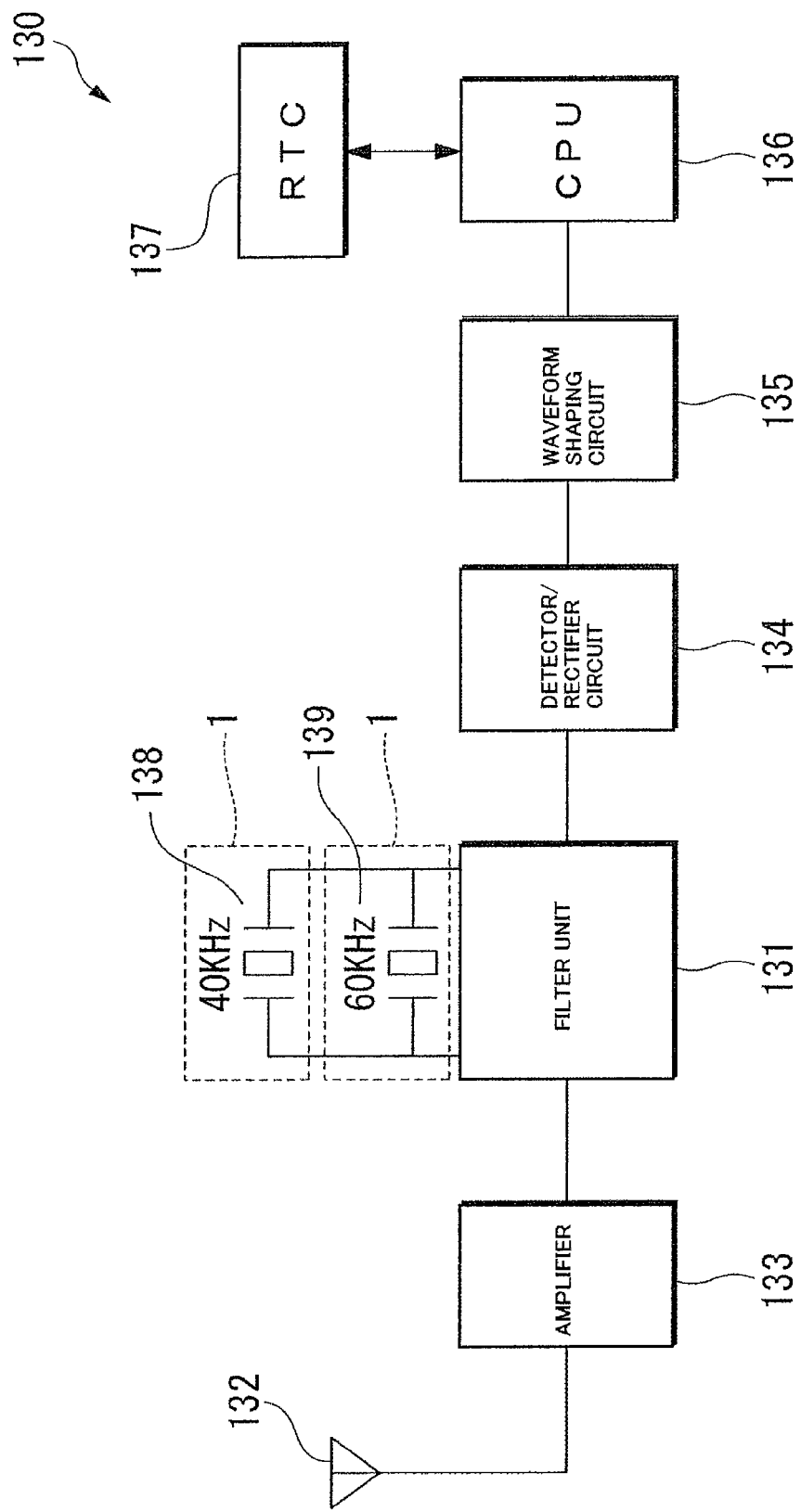
FIG. 9 is a configuration view illustrating a radio controlled timepiece according to the invention.

As illustrated in FIG. 9, the radio controlled timepiece 130 of the embodiment includes the piezoelectric vibrator 1 electrically connected to a filter section 131 and is a timepiece having functions for displaying the correct time by automatic correction by receiving a standard radio wave including timepiece information.

There are transmitting stations which transmit the standard radio waves in Fukushima (40 kHz) and Saga (60 kHz) in Japan, and the transmitting stations transmit the standard radio waves, respectively. Since a long wave such as 40 kHz or 60 kHz has both a property of propagating through the surface of the earth and a property of propagating through an ionized layer and the surface of the earth while being reflected, a propagation range is wide and can cover the entirety of Japan with the two transmitting stations described above.

Hereinafter, a functional configuration of the radio controlled timepiece 130 is described in detail.

An antenna 132 receives the standard radio wave of the long wave such as 40 kHz or 60 kHz. The standard radio wave of the long wave is obtained by applying AM modulation on a carrier wave of 40 kHz or 60 kHz to the time information referred to as a time code. The standard radio wave of the long wave which is received is amplified by an amplifier 133, and is filtered and tuned by the filter section 131 having a plurality of piezoelectric vibrators 1.

The piezoelectric vibrators 1 of the embodiment include crystal vibrator sections 138 and 139 having the resonance frequency of 40 kHz and 60 kHz which is the same as the carrier frequency described above, respectively.

Further, a signal of a predetermined frequency which is filtered is detected and demodulated by a detection and rectification circuit 134. Then, the time code is extracted through a waveform shaping circuit 135 and is counted in a CPU 136. The CPU 136 reads information such as the current year, the number of days, the day of the week, time or the like. The information that is read is reflected in an RTC 137 and correct time information is displayed.

Since the carrier wave is 40 kHz or 60 kHz, as the crystal vibrator sections 138 and 139, the vibrator having the tuning fork type structure described above is suitable.

Moreover, the above description is illustrated in the example in Japan, but the frequency of the standard radio wave of the long wave is different in foreign countries. For example, the standard radio wave of 77.5 KHz is used in Germany. Therefore, if the radio controlled timepiece 130 capable of corresponding to foreign countries is incorporated in the portable apparatus, it is further necessary to provide the piezoelectric vibrator 1 having a frequency different from that in Japan.

As described above, according to the radio controlled timepiece 130 of the embodiment, it is possible to provide the radio controlled timepiece 130 which can effectively suppress the vibration leakage similar to the above embodiments by including the piezoelectric vibrator 1 described above.

The embodiments of the invention are described in detail with reference to the drawings, but a specific configuration is not limited to the embodiments and other modifications or the like are also included without departing from the scope of the invention.

For example, in the above embodiments, as an example of the piezoelectric vibrator, the piezoelectric vibrator 1 of the ceramic package type is exemplified, but the invention is not limited to the embodiment. For example, the piezoelectric vibrator of the surface mount type may be formed by further fixing a piezoelectric vibrator of a glass package type, a piezoelectric vibrator of a surface mount type, and a piezoelectric vibrator of a cylinder package type, with a mold resin section. In addition, even though not described in detail above, the piezoelectric vibrator according to the invention is characterized by having "a convex section forming process" in which the width dimension Wa of the convex section 50 is determined, in the manufacturing process thereof. That is, after determining the outer appearance dimension, the groove dimension or the like based on a predetermined design value, the width dimension of the convex section 50 may be determined so that the effect of the reduction of the vibration leakage is obtained in a desired level.

Further, the base substrate is configured of two substrates of the first base substrate 10 and the second base substrate 11, but the base substrate may be configured of one sheet of the substrate and the concave section 40 may be formed on the mounting surface 11a. However, as described above, the base substrate is preferably configured of two substrates of the first base substrate 10 and the second base substrate 11. In this case, since the concave section 40 can be easily formed by bonding both the base substrates after forming the through hole in the second base substrate 11, it is possible to reduce the processing and the time used for forming the concave section.

In addition, it is also possible to appropriately replace the configuration elements in the embodiments described above with well-known configuration elements in a range without departing from the scope of the invention, and the modification examples described above may be appropriately combined.

What is claimed is:

1. A piezoelectric vibrating piece comprising:
   a base section having a pair of vibrating arm sections extending therefrom, the pair of vibrating arm sections disposed at a distance away from each other in a width direction of the base section, and having base ends extending from the base section; and
   a support arm section connected to the base section between the pair of vibrating arm sections and extending from the base section to the same side as the pair of vibrating arm sections,
   wherein a side surface of the base ends of the vibrating arm sections and side surfaces of the base section include a convex section that spans an interface region of the base ends and the base section, the convex section having parallel edges extending from the side surfaces and intersecting the side surfaces at substantially right angles.

2. The piezoelectric vibrating piece according to claim 1, wherein $0.2 \times W \leq Wa \leq 1.4 \times W$, where Wa is a maximum length of the convex sections in the width direction, and W is a width of the vibrating arm sections.

3. The piezoelectric vibrating piece according to claim 1, wherein leading ends of the vibrating arm sections include widened sections, and wherein leading ends of the convex sections are inward of the widened sections in the width direction.

4. A piezoelectric vibrator comprising:
   the piezoelectric vibrating piece according to claim 1; and
   a package that accommodates the piezoelectric vibrating piece,
   wherein electrode pads formed on a base substrate of the package is electrically connected to mount electrodes formed in the support arm section.

5. An oscillator comprising:
   the piezoelectric vibrator according to claim 4,
   wherein the piezoelectric vibrator is electrically connected to an integrated circuit as a resonator.

6. An electronic apparatus comprising:
   the piezoelectric vibrator according to claim 4,
   wherein the piezoelectric vibrator is electrically connected to a timer section.

7. A radio controlled timepiece comprising:
   the piezoelectric vibrator according claim 4,
   wherein the piezoelectric vibrator is electrically connected to a filter section.

* * * * *